(12) United States Patent
Buerkle et al.

(10) Patent No.: US 11,755,412 B2
(45) Date of Patent: *Sep. 12, 2023

(54) SEMICONDUCTOR DEVICE WITH MODIFIED COMMAND AND ASSOCIATED METHODS AND SYSTEMS

(71) Applicant: Micron Technology, Inc., Boise, ID (US)

(72) Inventors: Todd M. Buerkle, Boise, ID (US); Debra M. Bell, Boise, ID (US); Joshua E. Alzheimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/539,714

(22) Filed: Dec. 1, 2021

(65) Prior Publication Data

US 2022/0091938 A1    Mar. 24, 2022

Related U.S. Application Data

(63) Continuation of application No. 16/554,931, filed on Aug. 29, 2019, now Pat. No. 11,200,118.

(51) Int. Cl.
  *G11C 29/00* (2006.01)
  *G06F 11/10* (2006.01)
  *G11C 29/38* (2006.01)

(52) U.S. Cl.
  CPC ...... *G06F 11/1076* (2013.01); *G06F 11/1012* (2013.01); *G06F 11/1052* (2013.01); *G11C 29/38* (2013.01)

(58) Field of Classification Search
  CPC ............. G06F 11/1076; G06F 11/1012; G06F 11/1052; G11C 29/38
  See application file for complete search history.

(56) References Cited

U.S. PATENT DOCUMENTS

| 5,430,859 A | 7/1995 | Norman et al. |
| 6,212,631 B1 | 4/2001 | Springer et al. |
| (Continued) | | |

FOREIGN PATENT DOCUMENTS

| CN | 101401076 A | 4/2009 |
| CN | 101828175 A | 9/2010 |
| (Continued) | | |

OTHER PUBLICATIONS

Office Action dated Jun. 29, 2022 for Chinese Patent Application No. 202080059652.6, 11 pages.

(Continued)

*Primary Examiner* — Christine T. Tu
(74) *Attorney, Agent, or Firm* — Perkins Coie LLP

(57) ABSTRACT

Memory devices, systems including memory devices, and methods of operating memory devices are described, in which a host device may directly access a portion of memory array that is otherwise reserved for ECC functionality of a memory device. The memory array may correspond to a set of memory addresses, where each memory address of the set corresponds to a first portion of the memory array (e.g., user data plane) and to a second portion of the memory array (e.g., ECC plane). The second portion may be configured to store ECC data or second user data or metadata based on whether the ECC functionality is enabled or disabled. The memory device may determine a command directed to the memory address of the set is configured to access the first portion or the second portion based on a status of a pin associated with the command.

20 Claims, 6 Drawing Sheets

(56) References Cited

U.S. PATENT DOCUMENTS

| | | |
|---|---|---|
| 8,239,732 B2 | 8/2012 | Tan et al. |
| 8,495,467 B1 | 7/2013 | Billing et al. |
| 8,898,548 B1 | 11/2014 | Mullendore et al. |
| 9,594,676 B2 | 3/2017 | Radke et al. |
| 10,847,246 B2 | 11/2020 | Shin et al. |
| 10,963,336 B2 | 3/2021 | Veches |
| 11,042,436 B2 | 6/2021 | Jannusch et al. |
| 11,216,323 B2 * | 1/2022 | Ki .................. G06F 1/3287 |
| 11,379,299 B2 | 7/2022 | Veches |
| 2002/0013924 A1 | 1/2002 | Yamamoto |
| 2005/0144542 A1 | 6/2005 | Minagawa et al. |
| 2006/0218467 A1 | 9/2006 | Sibigtroth et al. |
| 2008/0072117 A1 | 3/2008 | Syzdek et al. |
| 2009/0113272 A1 | 4/2009 | Tan et al. |
| 2011/0252288 A1 | 10/2011 | Sharon et al. |
| 2013/0039129 A1 | 2/2013 | Radke et al. |
| 2013/0179752 A1 | 7/2013 | Shim et al. |
| 2014/0229655 A1 | 8/2014 | Goss et al. |
| 2014/0258811 A1 | 9/2014 | Liu et al. |
| 2014/0281808 A1 | 9/2014 | Lam |
| 2015/0033096 A1 | 1/2015 | Radke et al. |
| 2015/0100852 A1 | 4/2015 | Huang et al. |
| 2015/0169406 A1 | 6/2015 | Li et al. |
| 2015/0205665 A1 | 7/2015 | Kuo et al. |
| 2017/0308433 A1 | 10/2017 | Kwon et al. |
| 2018/0157441 A1 | 6/2018 | Bains et al. |
| 2018/0336090 A1 | 11/2018 | Minzoni |
| 2018/0336094 A1 | 11/2018 | Fu |
| 2018/0336959 A1 | 11/2018 | Minzoni |
| 2019/0050316 A1 | 2/2019 | Kim et al. |
| 2019/0179685 A1 | 6/2019 | Ki |
| 2019/0229753 A1 | 7/2019 | Cha |
| 2019/0243708 A1 | 8/2019 | Cha et al. |
| 2019/0250985 A1 | 8/2019 | Seo et al. |
| 2019/0347158 A1 * | 11/2019 | Chung ................ G06F 11/1044 |
| 2020/0151053 A1 | 5/2020 | Cha et al. |
| 2020/0183778 A1 * | 6/2020 | Kim ...................... G06F 3/0619 |
| 2020/0266929 A1 | 8/2020 | Wu et al. |
| 2021/0064461 A1 | 3/2021 | Veches |
| 2021/0064467 A1 | 3/2021 | Buerkle et al. |
| 2021/0216397 A1 | 7/2021 | Veches |
| 2021/0311822 A1 | 10/2021 | Jannusch et al. |
| 2022/0334917 A1 | 10/2022 | Veches |

FOREIGN PATENT DOCUMENTS

| | | |
|---|---|---|
| CN | 102163133 A | 8/2011 |
| CN | 102257573 A | 11/2011 |
| CN | 103197897 A | 7/2013 |
| CN | 103797541 A | 5/2014 |
| CN | 103984605 A | 8/2014 |
| CN | 106663045 A | 5/2017 |
| CN | 109964213 A | 7/2019 |
| CN | 110085277 A | 8/2019 |
| KR | 20080013992 A | 2/2008 |
| KR | 20130096753 A | 8/2013 |
| KR | 20170052576 A | 5/2017 |
| KR | 20170109568 A | 9/2017 |
| KR | 20190017223 A | 2/2019 |

OTHER PUBLICATIONS

International Application No. PCT/US2020/044654—International Search Report and Written Opinion, dated Nov. 11, 2020, 10 pages.
International Application No. PCT/US2020/044656—International Search Report and Written Opinion, dated Oct. 26, 2020, 8 pages.

* cited by examiner

SEMICONDUCTOR DEVICE WITH MODIFIED COMMAND AND ASSOCIATED METHODS AND SYSTEMS

CROSS-REFERENCE TO RELATED APPLICATION(S)

This application is a continuation of U.S. application Ser. No. 16/554,931, filed Aug. 29, 2019, now U.S. Pat. No. 11,200,118; which is incorporated herein by reference in its entirety.

TECHNICAL FIELD

The present disclosure generally relates to semiconductor devices, and more particularly relates to a semiconductor device with modified command and associated methods and systems.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Figure 1:
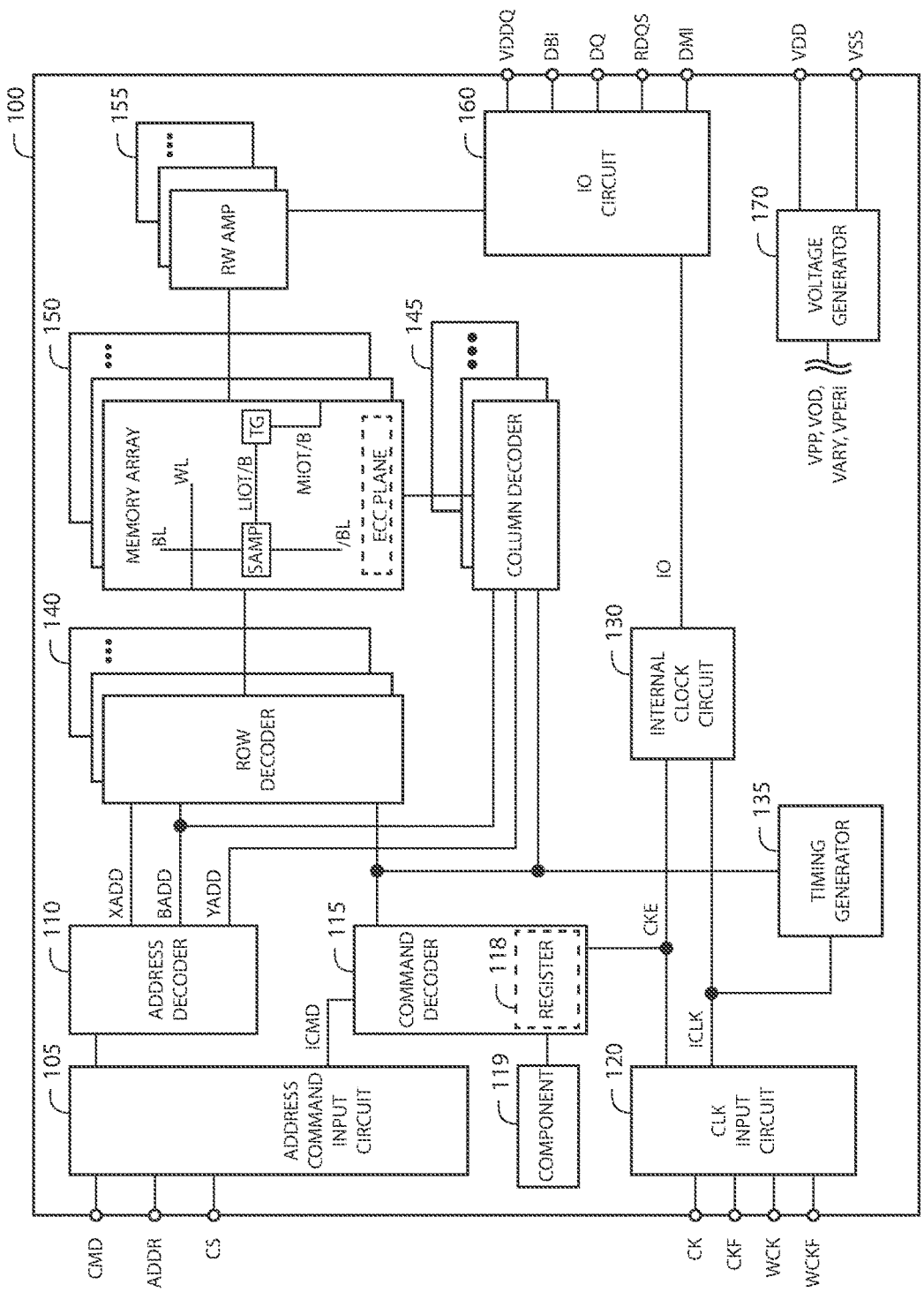
FIG. 1 is a block diagram schematically illustrating a memory device in accordance with an embodiment of the present technology.

A memory device may include error checking and correcting (ECC) functions to generate reliable data—e.g., on-die ECC functionality. An algorithm, program, or circuitry that performs the ECC function may be referred to as or include aspects of error-correcting codes. Such a memory device may include an ECC circuit and a group of memory cells (e.g., a portion of memory array configured to store ECC parity bits, and which may be variously referred to as an ECC array, an ECC plane, or a parity plane) that supports the on-die ECC functionality. In some embodiments, the group of memory cells may be reserved to internally store ECC data (e.g., internal to the memory device and inaccessible by users) and the specified storage capacity of the memory device may not include the ECC array capacity. In some examples, the ECC array capacity may occupy an appreciable portion of a total memory array space of the memory device—e.g., approximately 5 to 10% of the total memory array space.

In some memory systems that include a host device coupled with such memory devices, the host device (or the memory system) may perform its own ECC functions without entirely relying on the on-die ECC functionality. For example, the host device may be configured to directly access the ECC data from the group of memory cells such that the host device may carry out ECC functions using the ECC data without relying on the ECC circuit of the memory devices (or the ECC algorithm provided by the memory devices). In other examples, the host device may be configured to perform a system level ECC function independent of the ECC data or the ECC algorithm of the memory devices. As a result, the on-die ECC functionality may not be required by the memory system (or the host device) in some embodiments, and the memory device may be configured to provide additional features that may be otherwise unavailable—e.g., an additional storage capacity beyond the specified storage capacity indicated as available to users of the memory device.

Several embodiments of the present technology are directed to memory devices, systems including memory devices, and methods of operating memory devices in which a host device may directly access a portion of memory array reserved for ECC functions of the memory devices. As set forth herein, a memory device may include a memory array corresponding to a set of memory addresses, where each memory address of the set of memory addresses corresponds to a first portion of the memory array (e.g., main array, user data plane) configured to store user data and to a second portion of the memory array (e.g., ECC array, ECC plane, parity plane) configured to store ECC data associated with the user data of the first portion when an ECC function of the memory device is enabled. Additionally, the second portion of the memory array may be configured to store second user data (e.g., additional user data) or metadata associated with the memory device, or both, when the ECC function is disabled.

Metadata in a memory device may refer to various data associated with other data (e.g., data being transmitted or received) or operational aspects of the memory device, such as operating temperatures, latency settings, data transmission parameters. In some embodiments, the memory device may store the metadata in one or more registers, to which an output circuit of the memory device has access. In some embodiments, the memory device may store the metadata in the memory array (including the group of memory cells reserved for the ECC functionality, when the ECC functionality is disabled). After the memory device stores the metadata in the memory array, the metadata may be regarded as part of user data for future accesses. As such, the memory device may output the metadata (when stored in the memory array) without utilizing a separate command (e.g., mode register read (MRR) command to read the metadata stored in one or more registers) as part of access commands (e.g., read commands).

In one embodiment, the host device may modify an access command (e.g., a read command, a write command) to include an indication (e.g., a flag, a status) using one or more bits associated with the access command. The one or more bits may include bits corresponding to one or more pins (e.g., command and address pins, CA pins) that are not used in the access command. The one or more pins, however, may be used in other commands (e.g., non-access commands, ACT or Activate command). The indication may signify whether the access command is directed to the first portion (e.g., user data plane) or to the second portion (e.g., ECC plane). Upon determining that the access command is directed to the second portion of memory array based on the indication, the memory device may access (e.g., read from or write to) the second portion of memory array. In this manner, the host device may directly access the second portion of the memory array using the modified access command—e.g., retrieving the ECC data when the ECC function is enabled, storing or retrieving second user data or the metadata when the ECC function is disabled. In some embodiments, the memory device may configure the second subset of memory cells to store additional user-accessible data (e.g., the entire memory array configured to store user data) and store the metadata elsewhere—e.g., one or more registers of the memory device.

In some embodiments, the first portion (e.g., user data plane) of the memory array may be large enough to include sufficient data to fully populate the data bus for the duration of burst length of the device (e.g., burst length of sixteen (16), BL16). The second portion (e.g., ECC plane) of the memory array, however, may be small enough not to include sufficient data to fully populate the data bus for the duration of the burst length of the device (e.g., may include few enough bits to only fully populate the data bus for a burst length of eight (8), BL8). In some embodiments, various data channels (e.g., bus, interface) between the host device and the memory device may be configured to support a predetermined burst length (e.g., BL16) to access the memory array. Accordingly, when the access command is directed to the second portion, the memory device (or the host device) may have options for populating a remaining portion of the predetermined burst length (e.g., remaining eight (8) bursts out of sixteen (16) bursts) to fully utilize the predetermined burst length.

In some embodiments, the memory device (or the host device) may be configured to generate a second set of data from a first set of data (e.g., ECC data, second user data, or metadata) such that the memory device (or the host device) may populate the remaining portion of the predetermined burst length with the second set of data. For example, the second set of data may be a duplicate copy of the first set of data. Moreover, the second set of data may be configured to check if there is a transmission error in the first set of data. In other embodiments, the memory device (or the host device) may be configured to ignore the remaining portion of the first burst length thereby reducing power consumption. Further, the second set of data may be independent of the first set of data. For example, the second set of data may be an output from one or more registers of the memory device (e.g., one of multipurpose registers (MPRs)).

Figure 3:
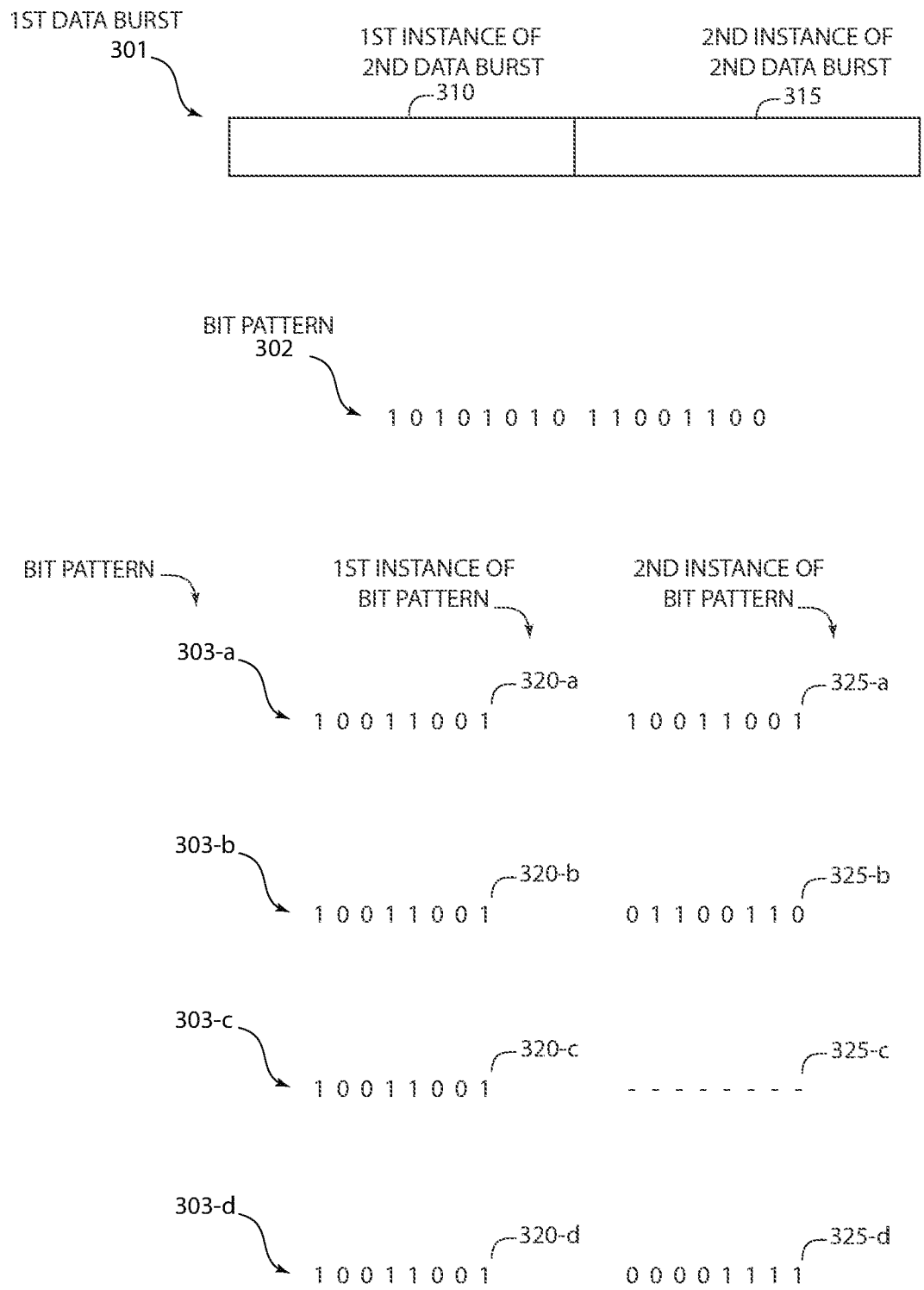
FIG. 3 is a block diagram schematically illustrating data bursts and corresponding bit patterns in accordance with an embodiment of the present technology.
Figure 4:
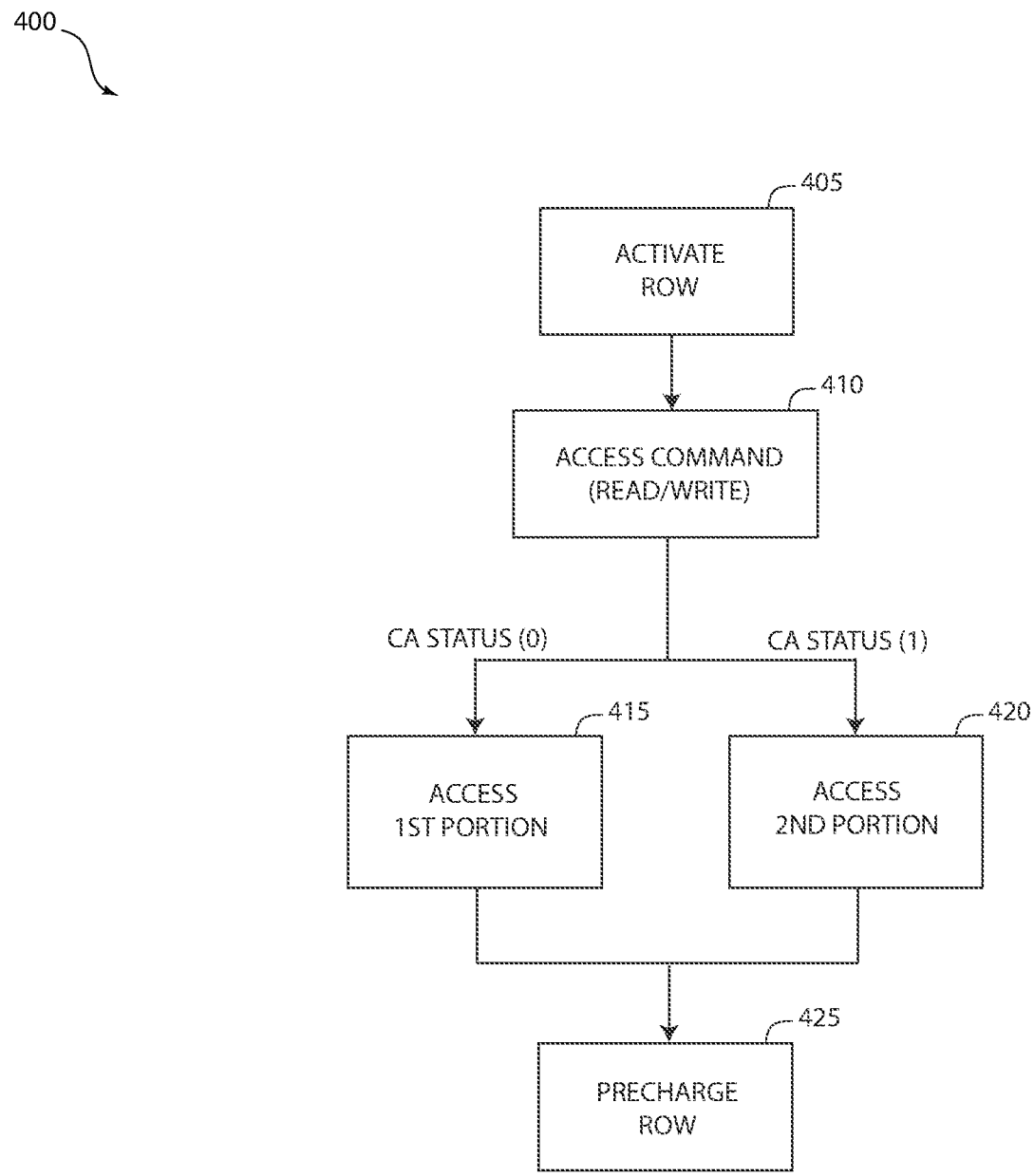
FIG. 4 is a flow chart illustrating an overall synopsis of a method of operating a memory device in accordance with an embodiment of the present technology.

A memory device that supports an embodiment of the present technology is described with reference to FIG. 1. More detailed descriptions of the memory device are provided with reference to FIG. 2. FIG. 3 illustrates various aspects of the burst lengths associated with operating the memory device in accordance with an embodiment of the present technology. FIG. 4 describes overall operations of the memory device in accordance with an embodiment of the present technology. A memory system that supports an embodiment of the present technology is described with reference to FIG. 5. A flowchart illustrating a method of operating the memory device is described with reference to FIG. 6.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells (e.g., m×n memory cells) arranged at intersections of the word lines (e.g., m word lines, which may also be referred to as rows) and the bit lines (e.g., n bit lines, which may also be referred to as columns). Memory cells can include any one of a number of different memory media types, including capacitive, magnetoresistive, ferroelectric, phase change, or the like. In some embodiments, a portion of the memory array 150 may be configurable to store ECC parity bits (e.g., ECC plane). That is, the memory array 150 may include a first portion configured to store user data and a second portion (e.g., ECC plane) configured to store different kinds of data—e.g., ECC data when an ECC function is enabled, non-ECC data when the ECC function is disabled. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches. The memory array 150 may also include plate lines and corresponding circuitry for managing their operation.

In some embodiments, the memory array 150 corresponds to a set of memory addresses, where each memory address of the set of addresses corresponds to a first portion of the memory array 150 and to a second portion of the memory array 150. Accordingly, when a memory address is provided by a host device, the memory address may concurrently identify the first portion and the second portion of the memory array 150. The first portion may be configured to store user data while the second portion may be configured to store different kinds of data based on whether an ECC function of the memory device 100 is enabled or disabled. For example, when the ECC function is enabled, the second portion may be configured to store ECC data associated with the user data of the first portion (e.g., ECC plane). In this manner, the ECC data stored in the second portion is associated with (e.g., linked with) the user data stored in the first portion to facilitate efficient executions of the ECC function of the memory device—e.g., a memory address identifying both locations of the user data and the ECC data linked with the user data.

In some embodiments, when the ECC function of the memory device 100 is disabled, however, the second portion may be configured to store other data (e.g., data other than the ECC data associated with the user data of the first portion). For example, the second portion may be configured to store second user data (e.g., to provide additional storage space for a host device), metadata associated with the memory device 100, or both. In some embodiments, the memory device 100 may include a register (e.g., mode register) configured to indicate whether the ECC function is enabled or disabled.

In some embodiments, a host device may access the second portion (e.g., ECC plane) of the memory array 150 regardless of whether the ECC function is enabled or disabled. For example, the host device may modify a status of one or more pins of the memory device 100 that are associated with an access command to indicate that the access command is directed to the ECC plane of the memory array 150. Subsequently, the memory device 100 may provide ECC data retrieved from the ECC plane to the host device in response to the access command and based on the status of the one or more pins. In some embodiments, the host device may choose to perform its own ECC function using the ECC data from the memory device 100. Unlike the on-die ECC function, the host device may be configured to perform an ECC function on any size of user data (e.g., a granularity of the user data size). In some embodiments, the host device may utilize a different ECC algorithm from the algorithm included in the on-die ECC function.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address portion of the ADDR input and supply the decoded bank address signal (BADD) to both the row decoder 140 and the column decoder 145. In some embodiments, the address decoder 110 (in conjunction with the command decoder 115, in some cases) identify the first portion (e.g., user data plane) and the second portion (e.g., ECC plane) based on a memory address associated with an access command. For example, when the ECC function of memory device 100 is enabled, the address decoder 110 may identify the first portion (e.g., to store user data or to retrieve user data) as well as the second portion (e.g., to store ECC data associated with the user data) based on the memory address. In some cases, the row decoder 140 may activate a row (e.g., row 0) that is common to the first portion and the second portion based on the decoded row address signal (XADD) supplied by the address decoder 110.

The command and address terminals may be supplied with command signals CMD, address signals ADDR, and chip select signals CS, from a memory controller. The command signals may represent various memory commands from the memory controller (e.g., including access commands, which can include read commands and write commands). The chip select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105.

The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown in FIG. 1). The command decoder 115, in some embodiments, may further include one or more registers 118 for tracking various counts or values (e.g., counts of refresh commands received by the memory device 100 or self-refresh operations performed by the memory device 100). In some embodiments, a subset of registers 118 may be referred to as mode registers and configured to store user-defined variables to provide flexibility in performing various functions, features, and modes (e.g., ECC modes).

In some embodiments, the command decoder 115 may determine whether an access command including a memory address of the memory array 150 is configured to access the first portion (e.g., user data plane) or the second portion (e.g., ECC plane) of the memory array 150. For example, the command decoder 115 may determine that the access command is directed to the second portion of the memory array 150 based on a status of one or more pins (e.g., a command and address pin, one of the pins designated to receive command signals CMD and address signals ADDR associated with the access command). The one or more pins assigned with the status of the access command may not be used in other access commands (e.g., a read command, a write command) such that modifying the bit to include such an indication (e.g., a status indicating whether the access command is directed to the first portion or the second portion) may not result in further modifications to the other access commands. In some embodiments, the memory device 100 may include a component 119 that may be coupled with the command decoder 115. The component 119 may be configured to block a host device from accessing the second portion (e.g., ECC plane) when the component 119 is activated.

In some embodiments, the memory device 100 may receive, from a host device, a command directed to the memory array 150 corresponding to a set of memory addresses each corresponding to a first portion (e.g., user data plane) of the memory array 150 configured to store user data and to a second portion (e.g., ECC plane) of the memory array 150 configured to store ECC data associated with the user data of the first portion when an ECC function of the memory device is enabled. The memory device 100 may access the second portion (e.g., ECC plane) of the memory array 150 in response to the command received from the host device and based on a status of one or more pins (e.g., one or more pins designated to receive command signals CMD and address signals ADDR, respectively) of the memory device 100 that indicate a type of access directed by the command.

When a read command is issued to a bank with an open row and a column address is timely supplied as part of the read command, read data can be read from memory cells in the memory array 150 designated by the row address (which may have been provided as part of the Activate command identifying the open row) and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (e.g., register 118). The read latency information RL can be defined in terms of clock cycles of the CK clock signal. For example, the read latency information RL can be a number of clock cycles of the CK signal after the read command is received by the memory device 100 when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in a mode register (e.g., register 118). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command decoder 115. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The 10 clock signals can be supplied to the input/output circuit 160 and can be used as a timing signal for determining an output timing of read data and the input timing of write data. The 10 clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

Figure 2:
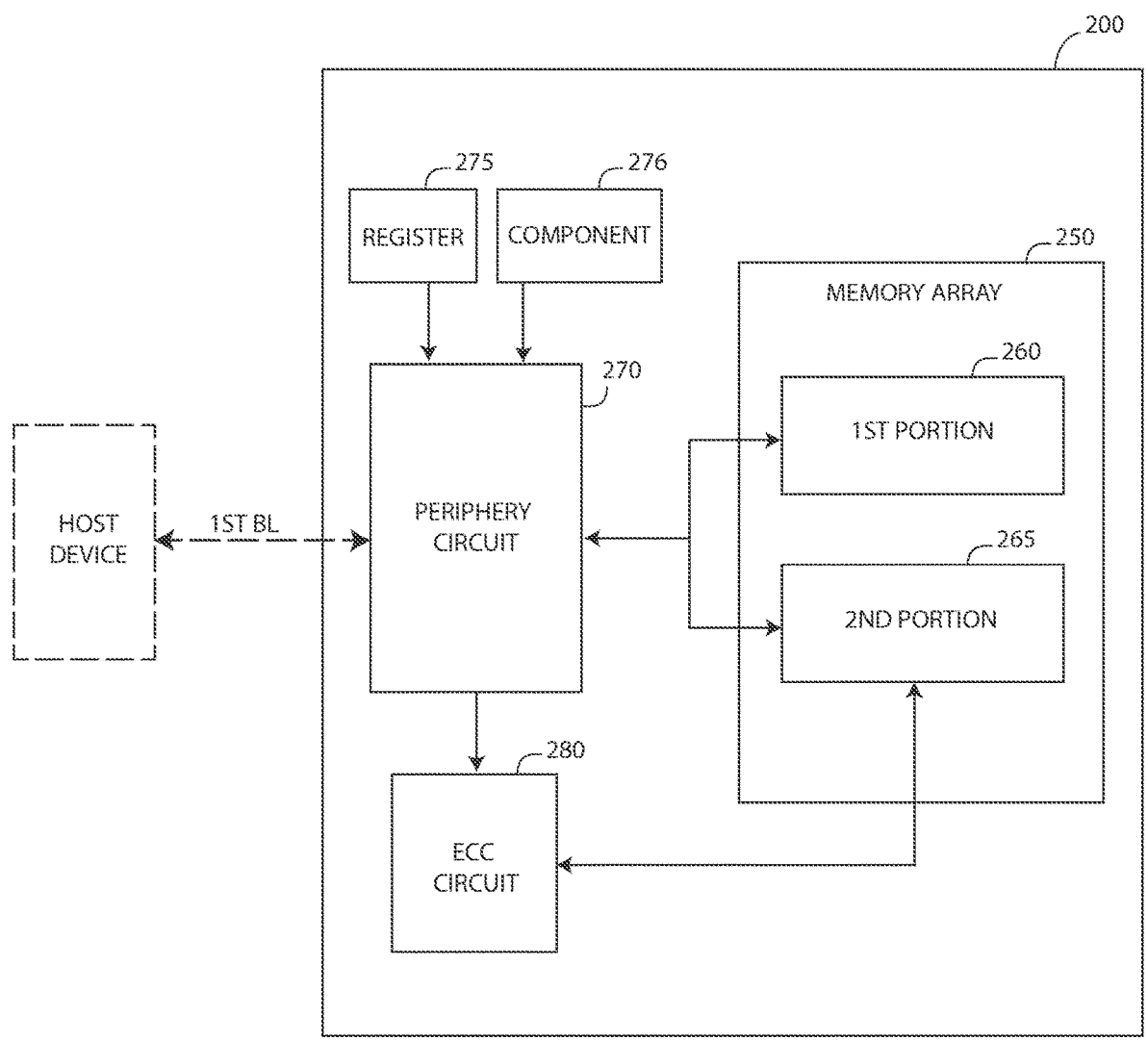
FIG. 2 is a block diagram schematically illustrating a memory device in accordance with an embodiment of the present technology.

FIG. 2 is a block diagram schematically illustrating a memory device 200 in accordance with an embodiment of the present technology. The memory device 200 may be an example or include aspects of the memory device 100 described with reference to FIG. 1. The memory device 200 may include a periphery circuit 270, a register 275 (which may be an example of or include aspects of the register 118), a component 276 (which may be an example of or include aspects of the component 119), an ECC circuit 280, and a memory array 250. The periphery circuit 270 may include aspects of various components described with reference to FIG. 1. For example, the periphery circuit 270 may include aspects of the command/address input circuit 105, the address decoder 110, the command decoder 115, and the input/output circuit 160, among others. Moreover, the memory array 250 may be an example of or include aspects of the memory array 150 described with reference to FIG. 1.

The memory array 250 may include a first portion 260 (e.g., main array, user data plane) configured to store user data and a second portion 265 (e.g., ECC array, ECC plane, parity plane) configured to store ECC data associated with the user data of the first portion 260 when an ECC function of the memory device 200 is enabled. In some embodiments, the memory array 250 may correspond to a set of memory address each corresponding to the first portion 260 and the second portion 265 of the memory array 250. Moreover, when the ECC function of the memory device is disabled, the second portion 265 may be configured to store second user data (e.g., to increase storage space available to the host device), metadata (e.g., to provide the metadata to the host device without incurring a separate command to read a mode register storing the metadata), or both. Metadata in a memory device may refer to various data associated with operational aspects of the memory device, such as operating temperatures, latency settings, data transmission parameters. As set forth herein, the memory device 200 may store the metadata in one or more registers, to which an output circuit of the memory device has access—e.g., via MRR command to read the metadata directly from the one or more registers. Additionally or alternatively, the memory device 200 may store the metadata in the memory array 250 (either in the first portion 260 or in the second portion 265 when the ECC functionality is disabled).

In some embodiments, the first portion 260 may occupy a major portion of the storage capacity of the memory array 250—e.g., greater than 90% of the storage capacity. Further, the second portion 265 may occupy a relatively minor but appreciable portion of the storage capacity of memory array 250—e.g., approximately 5 to 10% of the storage capacity. In other embodiments, the first portion 260 may have less than 90% of the capacity (e.g., 75%, 66%, or even 50% or less) while the second portion 265 may have greater than 5 to 10% of the storage capacity, correspondingly. Hence, relative allocations of capacity between the first portion 260 and the second portion 265 are exemplary purposes only and any allocation would be feasible for a person of ordinary skill in the art to devise. When the ECC function is disabled and the second portion 265 is configured to store additional user data (e.g., second user data), the memory device 200 may provide approximately 100% of the entire storage capacity (i.e., the entire storage capacity corresponding to the first portion 260 and the second portion 265) of the memory array 250 to the host device. That is, the memory device 200 can provide an extra storage capacity (i.e., the storage capacity corresponding to the second portion 265) to the host device in addition to the storage capacity corresponding to the first portion 260 (which may be referred to as the specified storage capacity of the memory device).

When the ECC function of the memory device 200 is enabled, the second portion 265 may be inaccessible by the host device in some embodiments. In such embodiments, the memory device 200 may output user data from the first portion 260 that have been checked using the ECC data stored in the second portion 265 in accordance with an ECC algorithm implemented in the memory device 200. For example, the memory device 200 may perform the ECC function on a 128-bit codeword stored in the first portion 260 using eight (8) parity bits stored in the second portion 265—e.g., a ratio of sixteen (16) between the user data size (e.g., 128 bits) and the ECC parity bit size (e.g., 8 bits) that is associated with the user data. In this manner, the host device may rely on the ECC function (e.g., the ECC algorithm implemented in the memory device 200) without having access to the ECC data stored in the second portion 265. In some embodiments, the ratio (e.g., an allocation of capacity between the first portion 260 and the second portion 265) may be determined based on a desired ECC functionality (e.g., detecting a first quantity of erroneous bits in a codeword, correcting a second quantity of erroneous bits in a codeword) of the memory device 200. The codeword may refer to the smallest size of data (e.g., a chunk of data) as a unit of transaction in the context of memory devices and systems.

In other embodiments, the second portion 265 may be accessible by the host device regardless of whether the ECC function is enabled or disabled—e.g., to provide ECC data to the host device when the ECC function is enabled, to provide additional storage capacity (e.g., by storing or retrieving additional user data to or from the second portion 265) or the metadata storage to the host device when the ECC function is disabled. In some embodiments, the host device may modify a status of one or more pins associated with an access command (e.g., a read command, a write command) directed to a memory address of the memory array 250 such that the memory device 200 may determine that the access command is directed to the second portion 265 based on the status of the one or more pins. In some embodiments, the one or more pins may be one of command and address pins that are not used by other access commands. In other embodiments, the one or more pins may be extra pins to the memory device 200.

When the host device accesses the ECC data from the second portion 265 (e.g., when the ECC function of the memory device 200 is enabled), the memory device 200 may provide ECC data retrieved from the second portion 265 to the host device. In some embodiments, the host device may choose to perform its own ECC function based on the ECC data. Unlike the on-die ECC function, the host device may be configured to perform an ECC function on any size of user data (e.g., a granularity of the user data size). For example, the host device may perform its own ECC function on user data having one kilo-byte (8,192 bits) based on receiving 512 bits of ECC data from the second portion 265. In another example, the host device may perform ECC function on the codeword (e.g., 128-bit code word) stored at the first portion 260 using 8 parity bits stored at the second portion 265. In yet another example, the host device may perform ECC function on any quantity of codeword (e.g., two (2) codewords, three (3) codewords) stored at the first portion 260 using corresponding quantity of parity bits (e.g., 16 parity bits, 24 parity bits) stored at the second portion 265.

When the host device accesses other data (e.g., additional user data, metadata, or both) from the second portion 265 (e.g., when the ECC function of the memory device 200 is disabled), the host device may perform its own ECC function on user data, which may be different than or the same as the ECC algorithm implemented in the memory device 200. As such, user data (e.g., user data of the first portion 260, additional (second) user data of the second portion 265) may be uncorrected by the ECC function of memory device 200. Such uncorrected user data may provide opportunities for the host device to optimize and/or modify its ECC algorithms in case of a change in error property and/or characteristics. Additionally or alternatively, the second portion 265 may be configured to store the metadata comprising information related to operational modes of the memory device 200 when the ECC function of the memory device 200 is disabled, such as, operating temperatures, latency settings associated with access commands, parameters for data transmissions, test modes, or a combination thereof. In this manner, the memory device 200 may provide the metadata when the host device accesses the second portion 265 using the modified access command without having to incur separate commands (e.g., a mode register read (MRR) command) to retrieve the metadata that may be stored otherwise in various registers (e.g., mode registers) of the memory device 200.

In some embodiments, the second portion 265 may be organized to be physically adjacent (or in close proximity) to the first portion 260 such that certain components of the memory device 200 (e.g., row decoder 140, column decoder 145, read/write amplifier 155, sense amplifiers (SAMP)) that support the first portion 260 and the second portion 265 may be shared or efficiently laid out. In other embodiments, the second portion 265 may be organized to be separate from the first portion 260 such that the first portion 260 and the second portion 265 may operate relatively independently of each other—e.g., the first and second portions having separate power domains, separate routings of control and/or data paths.

The register 275 (which may also be referred to as a mode register) may be configured to indicate whether an ECC function of the memory device 200 (e.g., on-die ECC functionality) is enabled or disabled. In some embodiments, a host device coupled with the memory device 200 may perform an ECC function without relying on the on-die ECC functionality of the memory device 200. In such cases, the register 275 may indicate that the on-die ECC functionality is disabled (e.g., by the host device) such that the memory device 200 may modify certain operational aspects to provide additional features to the host device.

The component 276 may be configured to block the host device from accessing the second portion 265 when the component 276 is activated. In some embodiments, the component 276 may include a fuse (or an array of fuses) and activating the fuse may include flowing an amount of electrical current adequate to cause the fuse to be electrically open (e.g., programmed). In other embodiments, the component 276 may include a register (e.g., a mode register) configured to store an indication that the host device is blocked from accessing the second portion 265.

The ECC circuit 280 provides an ECC function for the memory device 200 when the ECC function is enabled. The ECC circuit may be coupled with the second portion 265 and perform the ECC function for the first user-accessible data stored in the first portion 260 using the ECC data stored in the second portion 265. In some embodiments, the ECC circuit 280 may be configured to detect two or more errors and/or to correct one or more errors in the user data at the first portion 260. For example, the ECC circuit 280 may detect two bits of errors and correct one bit of error in the user data. In some embodiments, the ECC circuit 280 may be configured to indicate that the user data includes a quantity of errors greater than its detection and correction capability.

The periphery circuit 270 may be configured to communicate with the host device for a first burst length (e.g., BL16). The first burst length may be determined based on a configuration of the first portion 260 (e.g., an overall architecture of the memory array 250)), a codeword size (e.g., 128 bits), or data transmission channel configuration (e.g., ×8 configuration) between the memory device 200 and the host device, among others. For example, BL16 may be used to output a codeword of 128 bits from the first portion 260 via eight (8) data pins (e.g., eight (8) DQ pins) in parallel. In some cases, the first portion 260 may be configured to be compatible with the first burst length (e.g., BL16) and the second portion 265 may be configured to be compatible with a second burst length (e.g., BL8) that is less than the first burst length. For example, when the host device accesses the second portion 265 of memory array 250, the memory device 200 may retrieve data from the second portion 265 that corresponds to the second burst length (e.g., BL8). Accordingly, the periphery circuit 270 may be configured to accommodate the difference in burst lengths between the first portion 260 and the second portion 265—e.g., by preparing a set of data when the host device accesses the second portion 265 such that the set of data may be compatible with the first burst length that has been determined based on the factors described above.

FIG. 3 is a block diagram schematically illustrating data bursts and corresponding bit patterns in accordance with an embodiment of the present technology. FIG. 3 illustrates a first data burst 301 corresponding to a first burst length (e.g., BL16). In some embodiments, the first data burst 301 may include two instances of second data bursts 310 and 315 that each may include data that would otherwise be sufficient to populate a second, shorter burst length (e.g., BL8). Further, the first instance of second data burst 310 and the second instance of second data burst 315 may be consecutive (e.g., no interval or gap between the two) in one embodiment. FIG. 3 also illustrates bit patterns 302 and 303.

The bit pattern 302 may be an example of or include aspects of user data (e.g., 16 bits of data) transmitted through a data pin (e.g., one of DQ pins) when the host device accesses the first portion 260 of the memory array 250. The bit pattern 302 depicts sixteen (16) bits of data that may correspond to the first data burst 301 for the first burst length (e.g., BL16). In some embodiments, the data channels between the memory device 200 and the host device may be configured to have a ×8 configuration such that eight (8) DQ pins may collectively carry a 128-bit codeword during a period corresponding to a burst length of sixteen (16), BL16. For example, the first bit pattern 302 may be an example of 16-bit user data (e.g., 16-bit portion 1010101011001100 of a 128-bit codeword for BL16) directed to the first portion 260 when the host device accesses (e.g., write to or read from) the first portion 260 of the memory array 250.

The bit patterns 303 may be examples of or include aspects of ECC data, user data (e.g., second user data) or metadata transmitted through a data pin (e.g., one of DQ pins) when the host device accesses the second portion 265 of the memory array 250. Some bit patterns 303 may include sixteen (16) bits of data that correspond to the first data burst 301 for the first burst length (e.g., BL16). In some embodiments, the bit patterns 303 may include first instances of bit patterns 320 (e.g., the first instances of bit patterns 320-*a* through 320-*d*) and second instances of bit patterns 325

(e.g., the second instances of bit patterns 325-a through 325-d). For example, the bit pattern 303-a includes the first instance of bit pattern 320-a and the second instance of bit pattern 325-a, and the bit pattern 303-b includes the first instance of bit pattern 320-b and the second instance of bit pattern 325-b. The first instances of bit patterns 320 may correspond to the first instance of second data burst 310 and the second instances of bit patterns 325 may correspond to the second instance of second data burst 315.

As described herein, the second portion 265 of the memory array 250 may be configured to be compatible with a second burst length (e.g., BL8) that is less than the first burst length (e.g., BL16). Hence, the second portion 265 may support the first instance of bit pattern 320, but not the second instance of bit pattern 325 (or vice versa) whereas the data channel between the memory device 200 and the host device may be configured for the first burst length (e.g., BL16). Accordingly, in some embodiments, the memory device 200 (or the host device) may generate the second instance of bit pattern 325 (e.g., the second instance of bit pattern 325-a, the second instance of bit pattern 325-b) from the first instance of bit pattern 320 (e.g., the first instance of bit pattern 320-a, the first instance of bit pattern 320-b). For example, the memory device 200 (or the host device) may generate the second instance of bit pattern 325-a (e.g., 10011001) that is a duplicate copy of the first instance of bit pattern 320-a (e.g., 10011001)—e.g., the first instance of bit pattern 320 may be identical to the second instance of bit pattern 325. Alternatively, the memory device 200 (or the host device) may generate the second instance of bit pattern 325-b (e.g., 01100110) by inverting each bit of the first instance of bit pattern 320-b (e.g., 10011001). In such embodiments, the memory device 200 (or the host device) may check for a transmission error by comparing the first instance of bit pattern 320 and the second instance of bit pattern 325, where the transmission error may occur while user data associated with the first instance of bit pattern 320 is transmitted over the data channel.

In some embodiments, the memory device 200 (or the host device) may be configured not to generate the second instances of bit pattern 325 from the first instances of bit pattern 320. In such embodiments, the second instance of bit pattern (e.g., the second instance of bit pattern 325-d) may not include any data and the memory device 200 (or the host device) may reduce power consumption. In other words, the memory device 200 (or the host device) may communicate data (e.g., ECC data, second user data, metadata) directed to the second portion 265 of the memory array 250 during the first instance of second data burst 310 corresponding to the first instances of bit pattern 320 and ignore the second instance of second data burst 315 corresponding to the second instances of bit pattern 325. Moreover, in some embodiments, the memory device 200 may be configured to transmit another set of metadata (e.g., second metadata) during the second instance of second data burst 315 in addition to the first instance of second data burst 310. For example, the memory device 200 may transmit the first instance of bit pattern (e.g., the first instance of bit pattern 320-d) during the first instance of second data burst 310 and transmit the second instance of bit pattern (e.g., second instance of bit pattern 325-d including the second metadata) during the second instance of second data burst 315 as depicted in the bit pattern 303-d.

Although in the foregoing example embodiments, a first data burst having BL16 that includes two consecutive second data bursts of BL8 and corresponding bit patterns including sixteen (16) bits or eight (8) bits have been described and illustrated, in other embodiments, different configurations with the first data burst having a burst length other than BL16, the second data burst having a burst length other than BL8, and corresponding bit patterns may be utilized. For example, the first data burst may have BL24, BL32, and so on, each of which may include various quantities of second data bursts—e.g., three (3) second data bursts of BL8 to make the first data burst of BL24, six (6) second data bursts of BL4 to make the first data burst of BL24, two (2) second data bursts of BL16 to make the first data burst of BL32, and so on. Accordingly, bit patterns corresponding to the data bursts may also be different than the foregoing example. Moreover, the sequence between the first instance and the second instance of bit patterns may be interchangeable. For example, the second instance of bit pattern generated from the first instance of bit pattern may precede the first instance of bit pattern.

FIG. 4 is a flow chart 400 illustrating an overall synopsis of a method of operating a memory device in accordance with an embodiment of the present technology. The flow chart 400 may be an example of or include aspects of a method that the memory device 200 (or the periphery circuit 270 of the memory device 200) may perform. Such a memory device (e.g., the memory device 100 or 200) may include a memory array corresponding to a set of memory addresses, where each memory address of the set corresponds to a first portion (e.g., the first portion 260) of the memory array configured to store user data and to a second portion (e.g., the second portion 265) of the memory array configured to store ECC data associated with the user data of the first portion when an ECC function of the memory device is enabled. Further, the second portion of the memory array may be configured to store second user data, metadata, or both when the ECC function of the memory device is disabled. The memory device may include a component (e.g., the component 276) configured to block the host device from accessing the second portion when the component is activated. Additionally or alternatively, the memory device may include a register (e.g., the register 275) configured to indicate whether the ECC function is enabled or disabled.

At step 405, the memory device (e.g., the periphery circuit 270 of memory device 200) may activate a row of the memory array (e.g., the memory array 250) to open (e.g., activate) a row in a particular bank (e.g., banks 0-15 in the example of FIG. 1) for subsequent access operations. In some embodiments, the periphery circuit 270 may activate the row in conjunction with the address decoder 110 and/or the row decoder 140.

At step 410, the memory device may receive an access command from a host device. The access command may be a write command or a read command. In some embodiments, the periphery circuit 270 may receive the access command in conjunction with the command/address input circuit 105. Further, the memory device may determine whether the access command directed to the memory address of the set is configured to access the first portion or the second portion based on a status of a command and address pin associated with the command. For example, the status of the command and address pin (e.g., CA status) may correspond to a logic level "0" indicating that the access command is directed to the first portion (e.g., the first portion 260) of the memory array. Further, the status of the command and address pin (e.g., CA status) may correspond to a logic level "1" indicating that the access command is directed to the second portion (e.g., the second portion 265) of the memory array.

At step 415, the memory device may access the first portion (e.g., the first portion 260) of memory array based on determining that the access command is directed to the first portion (e.g., the CA status corresponding to the logic level "0"). When the access command is a read command, the memory device may retrieve user data (e.g., the user data including the bit pattern 302) from the first portion of memory array and transmit the user data (e.g., the first data burst 301) to the host device for a first burst length (e.g., BL16). When the access command is a write command, the memory device may receive user data from the host device for the first burst length and store the user data at the first portion of memory array.

Alternatively, at step 420, the memory device may access the second portion (e.g., the second portion 265) of memory array based on determining that the access command is directed to the second portion (e.g., the CA status corresponding to the logic level "1"). When the access command is a read command, the memory device may retrieve, from the second portion of memory array, a first set of data that includes ECC data, user data (e.g., second user data), metadata, or any combination thereof. In some embodiments, the memory device may retrieve the metadata from one or more registers or other components therein that are configured to store the metadata. In some embodiments, the first set of data may include a first instance of bit pattern (e.g., the first instances of bit patterns 320). Further, the memory device may generate a second set of data from the first set of data. In some embodiments, the second set of data may include a second instance of bit pattern (e.g., the second instances of bit patterns 325) from the first instance of bit pattern 320 as described with reference to FIG. 3.

Still referring to the step 420, the memory device may transmit the first set of data (e.g., the first instance of second data burst 310) for a first portion (e.g., BL8) of the first burst length (e.g., BL16) to the host device. Subsequently, the memory device may transmit the second set of data (e.g., the second instance of second data burst 315) for a second portion (e.g., BL8) of the first burst length (e.g., BL16) to the host device. In some embodiments, the second set of data may be transmitted immediately after the first set of the data—e.g., no interval or gap between transmitting the first and second set of data—such that the first set of data and the second set of data may be transmitted for the first burst length (e.g., BL16). In some embodiments, the memory device may transmit metadata (e.g., second metadata) for the second portion (e.g., BL8) of the first burst length (e.g., BL16) after transmitting the first set of data (e.g., the first instance of second data burst 310) for the first portion (e.g., BL8) of the first burst length (e.g., BL16). The metadata (e.g., the second metadata) may have been retrieved from other registers or components (e.g., registers other than the register 275, components other than the component 276) of the memory device.

When the access command is a write command, the memory device may receive a data burst (e.g., the first data burst 301) that includes user data (e.g., second user data) from the host device. In some embodiments, the user data may correspond to a first portion (e.g., the first instance of second data burst 310) of the data burst. In other embodiments, the user data may correspond to a second portion (e.g., the second instance of second data burst 315) of the data burst. In some embodiments, the memory device may check for a transmission error associated with the user data by comparing a first instance of bit pattern (e.g., the first instances of bit patterns 320) included in the first instance of second data burst 310 and a second instance of bit pattern (e.g., the second instances of bit patterns 325) included in the second instance of second data burst 315. Subsequently, the memory device may store the user data (e.g., the second user data) at the second portion (e.g., the second portion 265) of memory array. In some embodiments, when the access command is a write command, the memory device may receive a data burst that includes metadata previously transmitted to the host device. In some embodiments, the memory device may receive, from a host device, a write command that indicates to retrieve metadata (e.g., metadata stored in one or more registers) and to store the retrieved metadata in the memory array. In such embodiments, the host device may set a status of one or more pins of the memory device (e.g., command and address pins, CA pins) associated with the write command for such indication.

In some embodiments, the memory device may determine, before accessing the second portion, that the host device may access the second portion based on a status of a component (e.g., the component 276) of the memory device, where the component may be configured to block the host device from accessing the second portion when the component is activated. In some embodiments, the component may include a fuse (e.g., an array of fuses). Additionally or alternatively, the component may include another register (e.g., other than the register 275).

At step 425, the memory device (e.g., the periphery circuit 270 of memory device 200) may precharge the row of the memory array (e.g., the memory array 250) to deactivate the open row in the particular bank (or the open row in all banks). Accordingly, the bank(s) become available (e.g., in the idle state) for a subsequent row activation (e.g., another access command may be issued). In some embodiments, the periphery circuit 270 may precharge the row in conjunction with the address decoder 110 and/or the row decoder 140.

Figure 5:
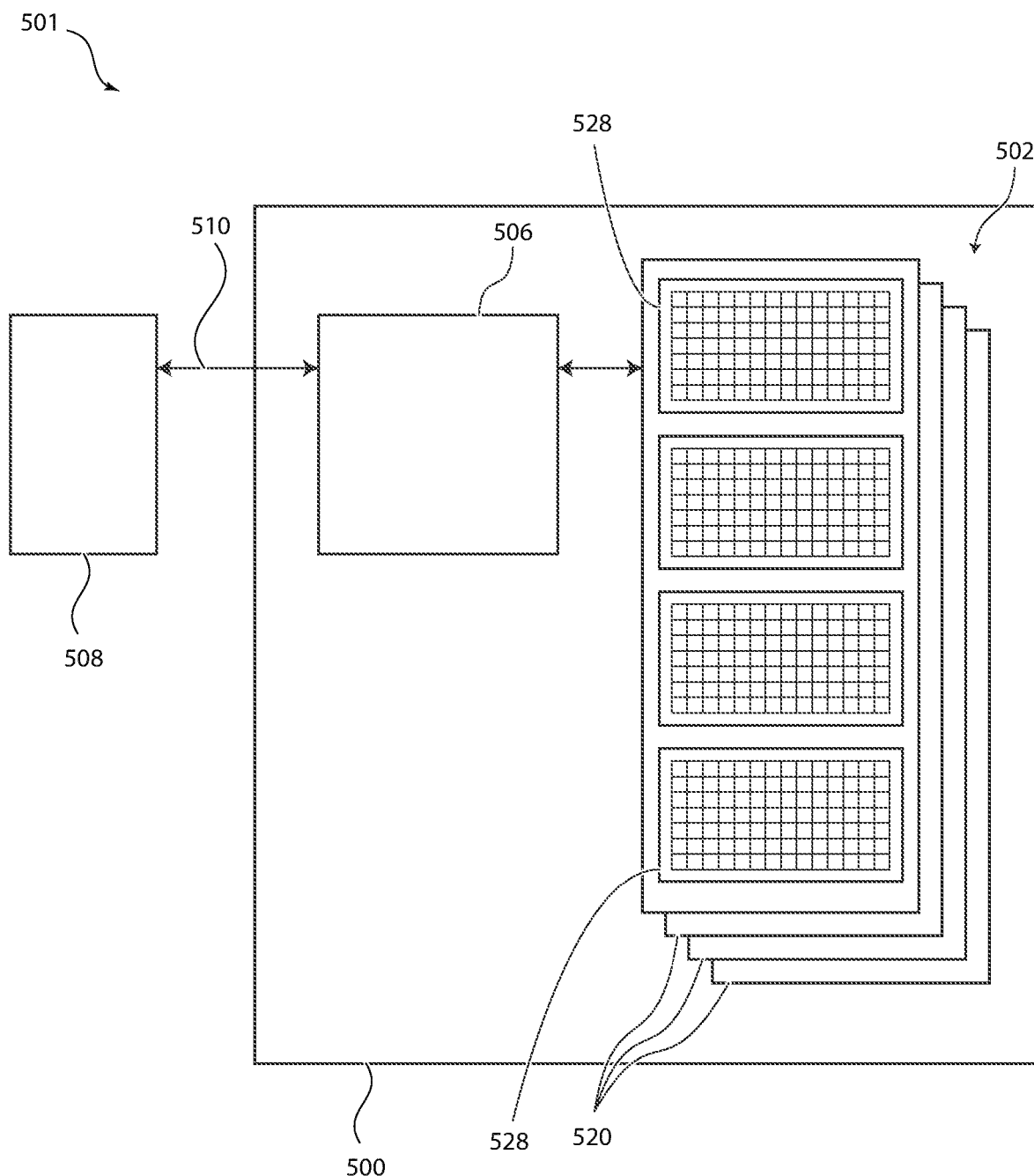
FIG. 5 is a block diagram schematically illustrating a memory system in accordance with an embodiment of the present technology.

FIG. 5 is a block diagram of a system 501 having a memory device 500 configured in accordance with an embodiment of the present technology. The memory device 500 may be an example of or include aspects of the memory devices 100 or 200 described with reference to FIGS. 1 and 2. As shown, the memory device 500 includes a main memory 502 (e.g., DRAM, NAND flash, NOR flash, FeRAM, PCM, etc.) and control circuitry 506 operably coupled to a host device 508 (e.g., an upstream central processor (CPU)). The main memory 502 may be an example of or include aspects of the memory array 150 or 250 described with reference to FIGS. 1 and 2. Further, the control circuitry 506 may be an example of or include aspects of the periphery circuit 270 described with reference to FIG. 2. The main memory 502 includes a plurality of memory units 520, which each include a plurality of memory cells. The memory units 520 can be individual memory dies, memory planes in a single memory die, a stack of memory dies vertically connected with through-silicon vias (TSVs), or the like. For example, in one embodiment, each of the memory units 520 can be formed from a semiconductor die and arranged with other memory unit dies in a single device package. In other embodiments, multiple memory units 520 can be co-located on a single die and/or distributed across multiple device packages. The memory units 520 may, in some embodiments, also be sub-divided into memory regions 528 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 502 and/or the individual memory units 520 can also include other circuit components, such as multiplexers, decoders, buffers, read/write drivers, address registers, data out/data in registers, etc., for accessing and/or programming (e.g., writing) the memory cells and other functionality, such as for processing information and/or communicating with the control circuitry 506 or the host device 508. Although shown in the illustrated embodiments with a certain number of memory cells, rows, columns, regions, and memory units for purposes of illustration, the number of memory cells, rows, columns, regions, and memory units can vary, and can, in other embodiments, be larger or smaller in scale than shown in the illustrated examples. For example, in some embodiments, the memory device 500 can include only one memory unit 520. Alternatively, the memory device 500 can include two, three, four, eight, ten, or more (e.g., 16, 32, 64, or more) memory units 520. Although the memory units 520 are shown in FIG. 5 as including four memory regions 528 each, in other embodiments, each memory unit 520 can include one, two, three, eight, or more (e.g., 16, 32, 64, 100, 128, 256 or more) memory regions.

In one embodiment, the control circuitry 506 can be provided on the same die as the main memory 502 (e.g., including command/address/clock input circuitry, decoders, voltage and timing generators, input/output circuitry, etc.). In another embodiment, the control circuitry 506 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 506 can include a processor configured to execute instructions stored in memory to perform various processes, logic flows, and routines for controlling operation of the memory device 500, including managing the main memory 502 and handling communications between the memory device 500 and the host device 508. In some embodiments, the control circuitry 506 can include embedded memory with memory registers for storing, e.g., row counters, bank counters, memory pointers, fetched data, etc. In another embodiment of the present technology, a memory device 500 may not include control circuitry, and may instead rely upon external control (e.g., provided by the host device 508, or by a processor or controller separate from the memory device 500).

The host device 508 can be any one of a number of electronic devices capable of utilizing memory for the temporary or persistent storage of information, or a component thereof. For example, the host device 508 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 508 may be a networking device (e.g., a switch, a router, etc.) or a recorder of digital images, audio and/or video, a vehicle, an appliance, a toy, or any one of a number of other products. In one embodiment, the host device 508 may be connected directly to memory device 500, although in other embodiments, the host device 508 may be indirectly connected to memory device (e.g., over a networked connection or through intermediary devices).

In operation, the control circuitry 506 can directly write or otherwise program (e.g., erase) the various memory regions of the main memory 502. The control circuitry 506 communicates with the host device 508 over a host-device bus or interface 510. In some embodiments, the host-device bus or interface 510 may be configured to carry data bursts having a predetermined burst length. For example, the host-device bus or interface 510 may carry data bursts having a first burst length (e.g., BL16). In some embodiments, the host device 508 and the control circuitry 506 can communicate over a dedicated memory bus (e.g., a DRAM bus). In other embodiments, the host device 508 and the control circuitry 506 can communicate over a serial interface, such as a serial attached SCSI (SAS), a serial AT attachment (SATA) interface, a peripheral component interconnect express (PCIe), or other suitable interface (e.g., a parallel interface). The host device 508 can send various requests (in the form of, e.g., a packet or stream of packets) to the control circuitry 506. A request can include a command to read, write, erase, return information, and/or to perform a particular operation (e.g., a refresh operation, a TRIM operation, a precharge operation, an activate operation, a wear-leveling operation, a garbage collection operation, etc.).

In some embodiments, the control circuitry 506 can be configured to track operations (e.g., read operations, write operations, erase operations, activate operations, etc.) performed in the main memory 502 (e.g., in a register or table in an embedded memory of the control circuitry 506) in multiple memory units 520 to facilitate performing refresh operations on an as-needed basis. In this regard, the control circuitry 506 can be configured to compare the number or rate of operations experienced by different memory units 520 and to perform or schedule refresh operations on the memory units 520 based on a comparison between the number or rate of operations experienced by the memory units 520. Alternatively, the control circuitry 506 can be configured to perform or schedule refresh operations on the memory units 520 based on a comparison of each memory unit 520 to one or more predetermined thresholds (e.g., threshold numbers of operations, threshold rates of operations, etc.). Accordingly, a memory unit 520 which is the target of operations that exceed a threshold number or rate can be refreshed more frequently than another unit 520, due to the freedom with which different units 520 can be subjected to out-of-order refresh operations.

In some embodiments, the memory device 500 may include a memory array corresponding to a set of memory addresses, where each memory address of the set corresponds to a first portion of the memory array configured to store user data and to a second portion of the memory array configured to store ECC data associated with the user data of the first portion when an ECC function of the memory device is enabled, and to store second user data, metadata associated with the memory device, or both when the ECC function of the memory device is disabled. In some embodiments, the host device 508 may be configured to set a status of one or more pins of the memory device (e.g., one or more pins designated to receive command signals CMD and address signals ADDR associated with the access command as described with reference to FIG. 1) that indicates a type of access of a command addressed to the memory address of the set of memory addresses. In some embodiments, the memory device 500 may be configured to receive, from the host device, the command addressed to the memory address, access the second portion of the memory array in response to the command received from the host device, and based on the status of the one or more pins, and communicate with the host device data to or from the second portion of the memory array in response to the command.

In some embodiments, the command may be a read command and the memory device 500 may transmit a set of data including the ECC data, the second user data, the metadata, or any combination thereof, for a burst length (e.g., BL16), and the host device may be further configured to check for a transmission error by comparing a first portion of the set of data and a second portion of the set of data. In some embodiments, the command may be a write command and the host device may transmit a set of data including the second user data for a burst length, and the memory device may be further configured to check for a transmission error by comparing a first portion of the set of data and a second portion of the set of data. In some embodiments, the first portion of the set of data may correspond to a first one half of the burst length and the second portion of the set of data may correspond to a second one half of the burst length.

Figure 6:
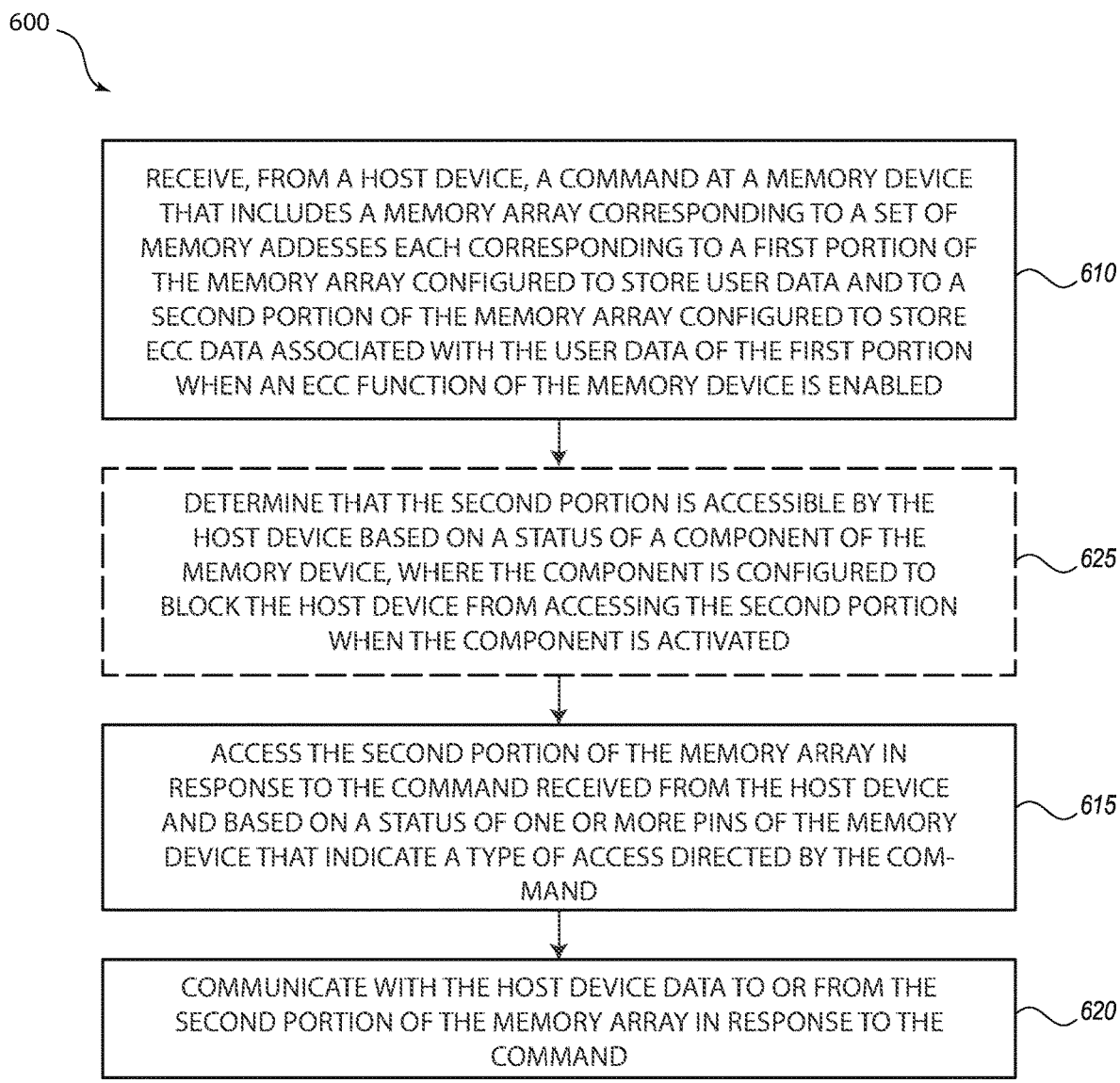
FIG. 6 is a flow chart illustrating a method of operating a memory device in accordance with an embodiment of the present technology.

FIG. 6 is a flow chart 600 illustrating a method of operating a memory device in accordance with an embodiment of the present technology. The flow chart 600 may be an example of or include aspects of a method that the memory device 200 (or the periphery circuit 270 of the memory device 200) may perform as described with reference to FIGS. 2 and 3. Such a memory device (e.g., the memory device 100 or 200) may include a memory array corresponding to a set of memory addresses, where each memory address of the set corresponds to a first portion (e.g., the first portion 260) of the memory array configured to store user data and to a second portion (e.g., the second portion 265) of the memory array configured to store ECC data associated with the user data of the first portion when an ECC function of the memory device is enabled. Further, the second portion of the memory array may be configured to store second user data, metadata, or both when the ECC function of the memory device is disabled. The memory device may include a component (e.g., the component 276) configured to block the host device from accessing the second portion when the component is activated.

The method includes receiving, from a host device, a command at a memory device that includes a memory array corresponding to a set of memory addresses each corresponding to a first portion of the memory array configured to store user data and to a second portion of the memory array configured to store ECC data associated with the user data of the first portion when an ECC function of the memory device is enabled (box 610). In accordance with one aspect of the present technology, the receiving feature of box 610 can be performed by a periphery circuit (e.g., the periphery circuit 270 of FIG. 2) or control circuitry (e.g., the control circuitry 506 of FIG. 5) in conjunction with the command/address input circuit 105 as described with reference to FIG. 1.

The method further includes accessing the second portion of the memory array in response to the command received from the host device and based on a status of one or more pins of the memory device that indicate a type of access directed by the command (box 615). In accordance with one aspect of the present technology, the accessing feature of box 615 can be performed by the periphery circuit (e.g., the periphery circuit 270 of FIG. 2) or the control circuitry (e.g., the control circuitry 506 of FIG. 5) in conjunction with the row decoder 140 and the column decoder 145 as described with reference to FIG. 1.

The method further includes communicating with the host device data to or from the second portion of the memory array in response to the command (box 620). In accordance with one aspect of the present technology, the communicating feature of box 620 can be performed by the periphery circuit (e.g., the periphery circuit 270 of FIG. 2) or the control circuitry (e.g., the control circuitry 506 of FIG. 5) in conjunction with the input/output circuit 160 as described with reference to FIG. 1.

The method can further include determining, before accessing the second portion, that the second portion is accessible by the host device based on a status of the component (e.g., the component 276) of the memory device, where the component is configured to block the host device from accessing the second portion when the component is activated (box 625). In accordance with one aspect of the present technology, the determining feature of box 625 can be performed by the periphery circuit (e.g., the periphery circuit 270 of FIG. 2) or the control circuitry (e.g., the control circuitry 506 of FIG. 45).

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus comprising:
a memory array corresponding to a plurality of memory addresses each corresponding both to a first portion of the memory array configured to store user data and to a second portion of the memory array configured to 1) store error-correcting code (ECC) data corresponding to the user data when an ECC function of the apparatus is enabled and 2) store non-ECC data not corresponding to the user data when the ECC function is disabled; and
circuitry configured to:
receive a command directed to the memory array;
access the second portion of the memory array in response to the command; and
communicate either the ECC data or the non-ECC data to or from the second portion of the memory array in response to the command.

2. The apparatus of claim 1, further comprising:
a register configured to indicate whether the ECC function is enabled or disabled.

3. The apparatus of claim 1, further comprising:
a component configured to block access to the second portion when the component is activated.

4. The apparatus of claim 1, wherein the command indicates whether the command is directed to the first portion or the second portion of the memory array.

5. The apparatus of claim 1, wherein the circuitry is configured to communicate for a first burst length when the command is directed to the first portion and to communicate for a second burst length that is less than the first burst length when the command is directed to the second portion.

6. The apparatus of claim 1, wherein the circuitry is configured to communicate for a same burst length whether the command is directed to the first portion or to the second portion, and wherein the circuitry is further configured to communicate the non-ECC data and additional data when the command is directed to the second portion.

7. The apparatus of claim 6, wherein the additional data is (i) duplicative of the non-ECC data, (ii) read from a mode register of the apparatus, (iii) metadata corresponding to a status of the apparatus, or (iv) a combination thereof.

8. The apparatus of claim 6, wherein the additional data consists of multiple instances of a single bit state.

9. A method comprising:
receiving, from a host device, a command at a memory device that includes a memory array corresponding to a plurality of memory addresses each corresponding both to a first portion of the memory array configured to store user data and to a second portion of the memory array configured to 1) store error-correcting code (ECC) data associated with the user data when an ECC function of the memory device is enabled and 2) store non-ECC data not corresponding to the user data when the ECC function is disabled;
accessing the second portion of the memory array in response to the command; and
communicating, with the host device, either the ECC data or the non-ECC data to or from the second portion of the memory array in response to the command.

10. The method of claim 9, further comprising:
determining, before accessing the second portion, that the second portion is accessible by the host device based on a status of a component of the memory device, the component configured to block the host device from accessing the second portion when the component is activated.

11. The method of claim 9, further comprising:
retrieving either the ECC data or the non-ECC data from the second portion, wherein the command received from the host device comprises a read command.

12. The method of claim 11, further comprising:
transmitting either the ECC data or the non-ECC data for a portion of a first burst length, wherein the memory device is configured to communicate with the host device for the first burst length when the command is configured to access the first portion of the memory array.

13. The method of claim 11, further comprising:
transmitting either the ECC data or the non-ECC data for a second burst length that is less than a first burst length, wherein the memory device is configured to communicate with the host device for the first burst length when the command is configured to access the first portion of the memory array and to communicate with the host device for the second burst length when the command is configured to access the second portion of the memory array.

14. The method of claim 9, further comprising:
retrieving a first set of data from the second portion of the memory array, the first set of data including either the ECC data or the non-ECC data, wherein the command comprises a read command; and
generating a second set of data from the first set of data, wherein the second set of data is configured to check a transmission error in the first set of data.

15. The method of claim 14, further comprising:
transmitting the first set of data and the second set of data for a first burst length, wherein the memory device is configured to communicate with the host device for the first burst length when the command is configured to access the first portion of the memory array.

16. The method of claim 9, further comprising:
storing the non-ECC data associated with a write command in the second portion of the memory array, wherein the command comprises the write command.

17. A memory system comprising:
a host device; and
a memory device including a memory array corresponding to a plurality of memory addresses, each corresponding both to a first portion of the memory array configured to store user data and to a second portion of the memory array configured to 1) store error-correcting code (ECC) data corresponding to the user data when an ECC function of the memory device is enabled and 2) store non-ECC data not corresponding to the user data when the ECC function is disabled,
wherein the memory device is configured to:
receive a command from the host device;

access the second portion of the memory array in response to the command; and communicate either the ECC data or the non-ECC data to or from the second portion of the memory array in response to the command.

18. The memory system of claim 17, wherein the command is a read command and the memory device transmits a set of data including either the ECC data or the non-ECC data, and wherein the host device is further configured to check for a transmission error by comparing a first portion of the set of data and a second portion of the set of data.

19. The memory system of claim 17, wherein the command is a write command and the host device transmits a set of data including the non-ECC data, and wherein the memory device is further configured to check for a transmission error by comparing a first portion of the set of data and a second portion of the set of data.

20. The memory system of claim 19, wherein the host device transmits the set of data for a burst length, wherein the first portion of the set of data corresponds to a first one half of the burst length, and wherein the second portion of the set of data corresponds to a second one half of the burst length.

* * * * *